United States Patent  
Liu et al.

(10) Patent No.: US 9,263,542 B2
(45) Date of Patent: Feb. 16, 2016

(54) SEMICONDUCTOR DEVICE HAVING A CHARGED INSULATING LAYER

(71) Applicants: TAIWAN SEMICONDUCTOR MANUFACTURING COMPANY LTD., Hsinchu (TW); NATIONAL TAIWAN UNIVERSITY, Taipei (TW)

(72) Inventors: Chee-Wee Liu, Taipei (TW); Yen-Yu Chen, Kaohsiung (TW); Hsuan-Yi Lin, Taipei (TW); Cheng-Yi Peng, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/451,743

(22) Filed: Aug. 5, 2014

(65) Prior Publication Data

US 2015/0364566 A1 Dec. 17, 2015

Related U.S. Application Data

(60) Provisional application No. 62/011,835, filed on Jun. 13, 2014.

(51) Int. Cl.
  *H01L 29/74* (2006.01)
  *H01L 29/51* (2006.01)
  *H01L 29/40* (2006.01)

(52) U.S. Cl.
  CPC ............ *H01L 29/517* (2013.01); *H01L 29/401* (2013.01); *H01L 29/518* (2013.01)

(58) Field of Classification Search
  CPC .... H01L 29/517; H01L 29/518; H01L 29/401
  See application file for complete search history.

(56) References Cited

U.S. PATENT DOCUMENTS

2014/0235058 A1* 8/2014 Mauder et al. ................. 438/702

FOREIGN PATENT DOCUMENTS

KR 1286704 * 3/2013

* cited by examiner

*Primary Examiner* — Long Pham
(74) *Attorney, Agent, or Firm* — WPAT, P.C.; Anthony King

(57) ABSTRACT

A semiconductor device comprises a substrate, an active layer over the substrate, and an insulating layer between the substrate and the active layer. The insulating layer is doped with one of positive charge and negative charge and configured to establish an electric field across the active layer when the semiconductor device is powered.

14 Claims, 17 Drawing Sheets

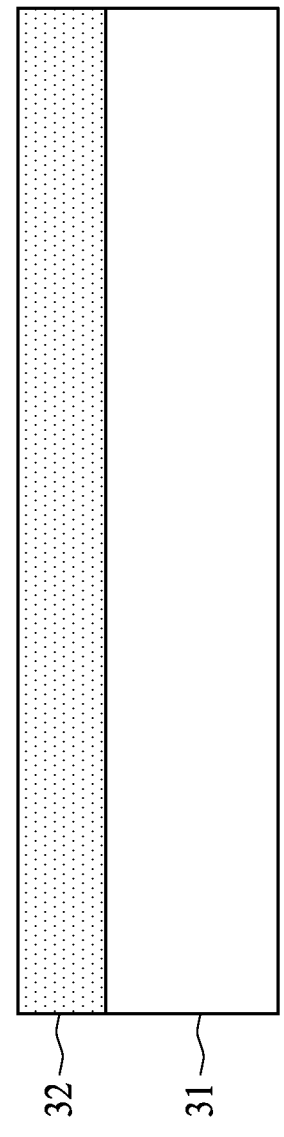
FIGURE 3A
FIGURE 3B

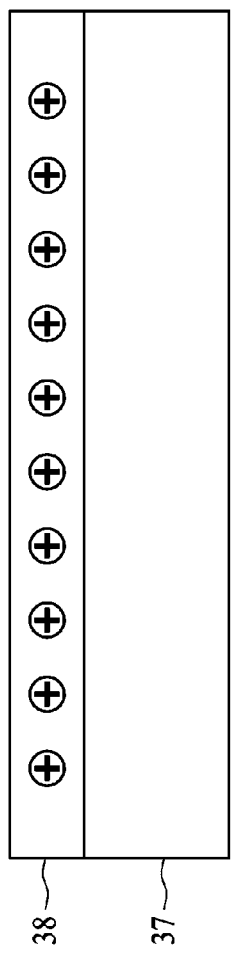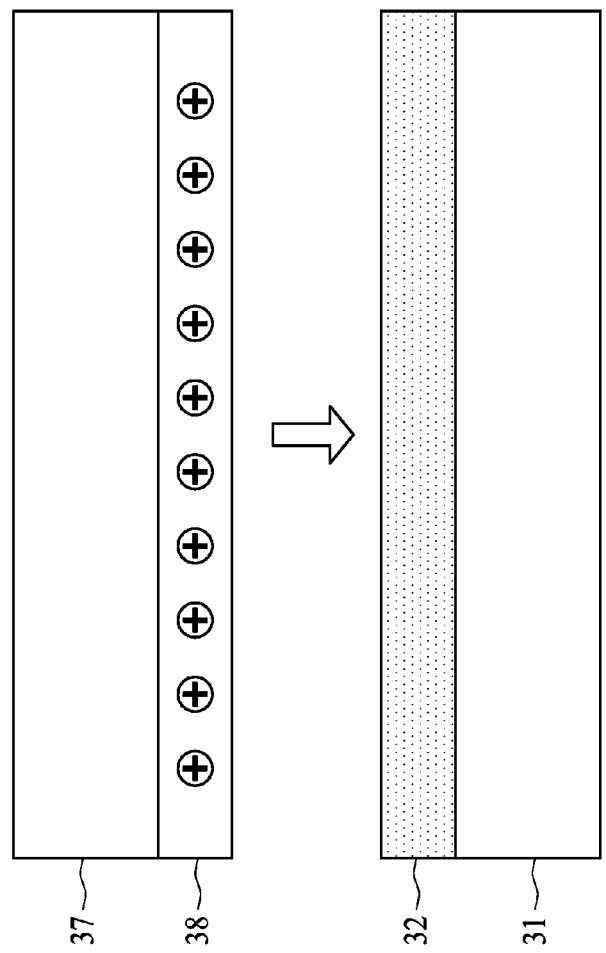

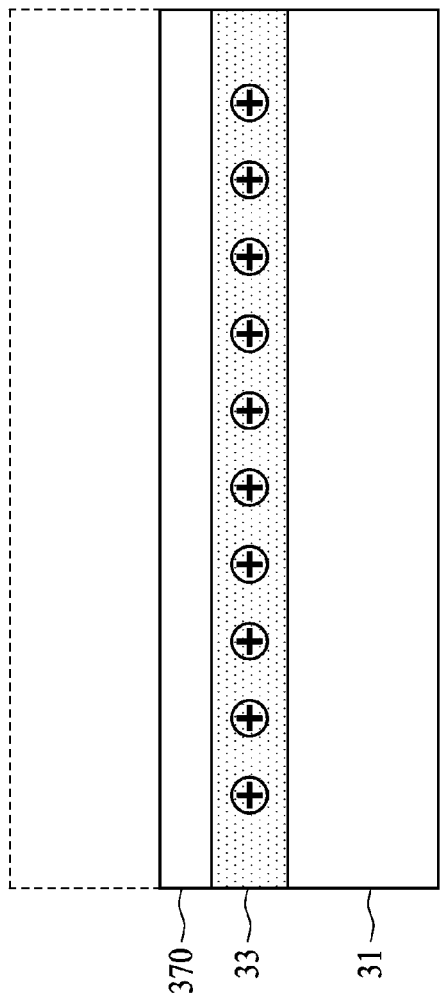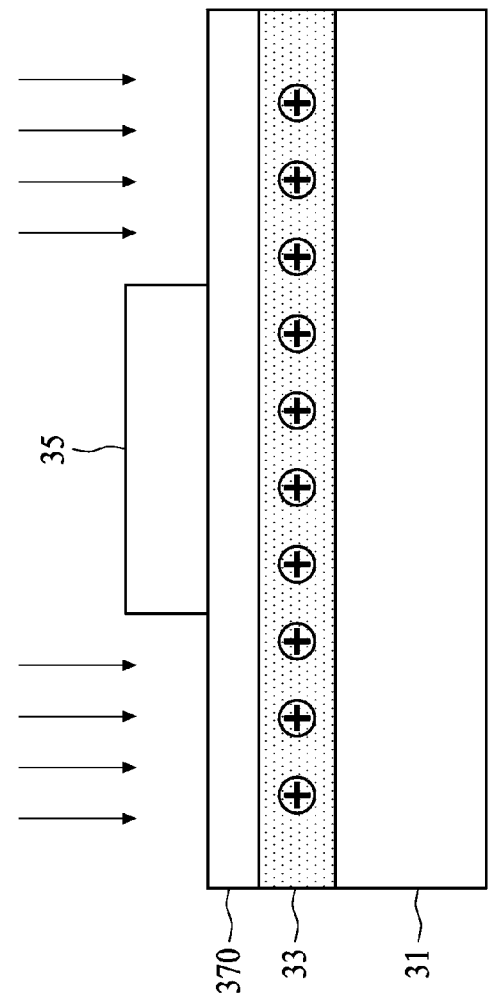

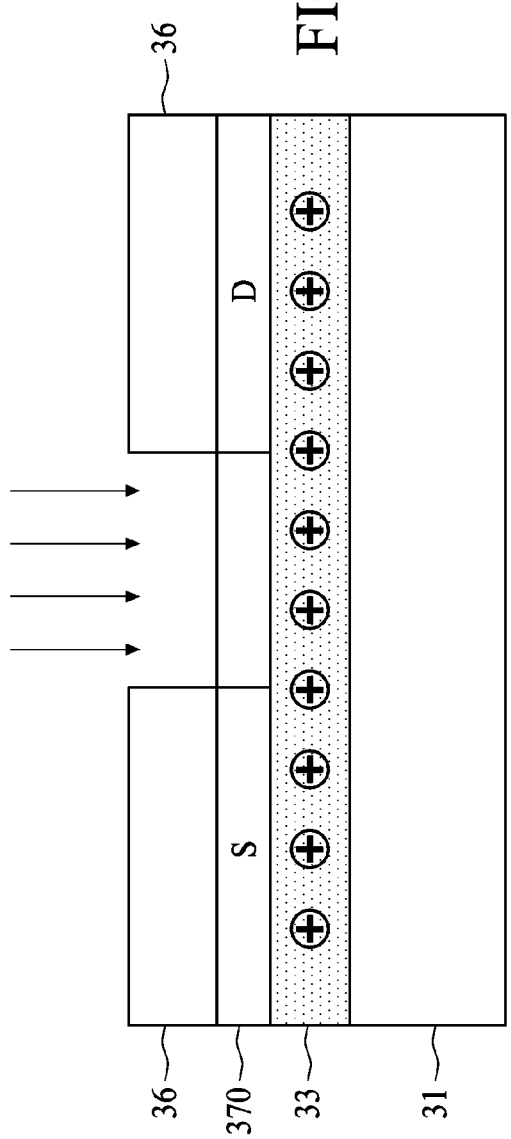
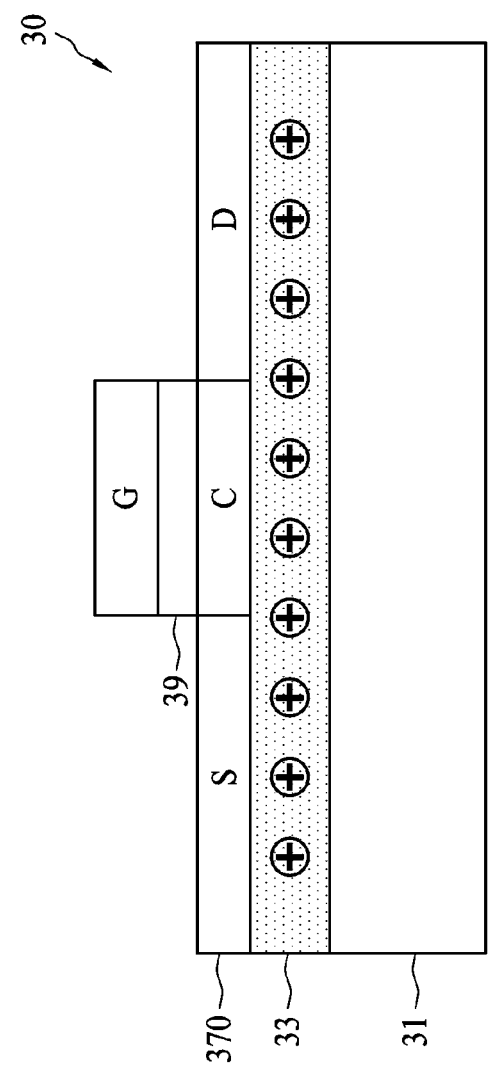

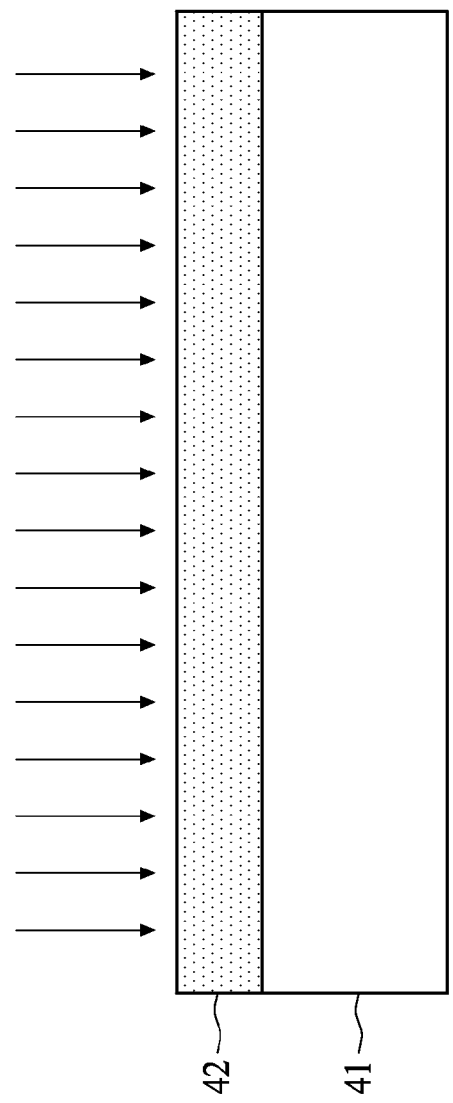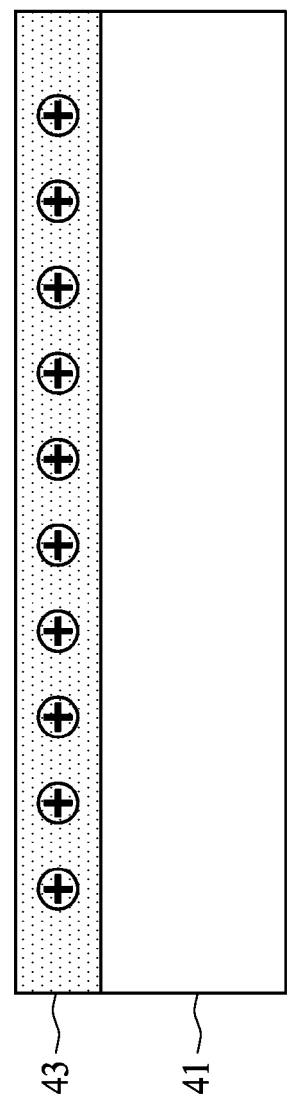
FIGURE 4A
FIGURE 4B

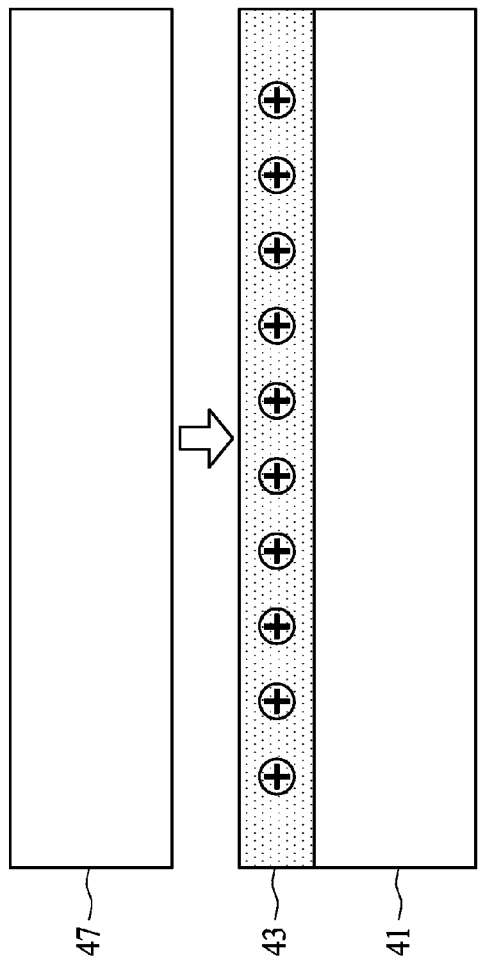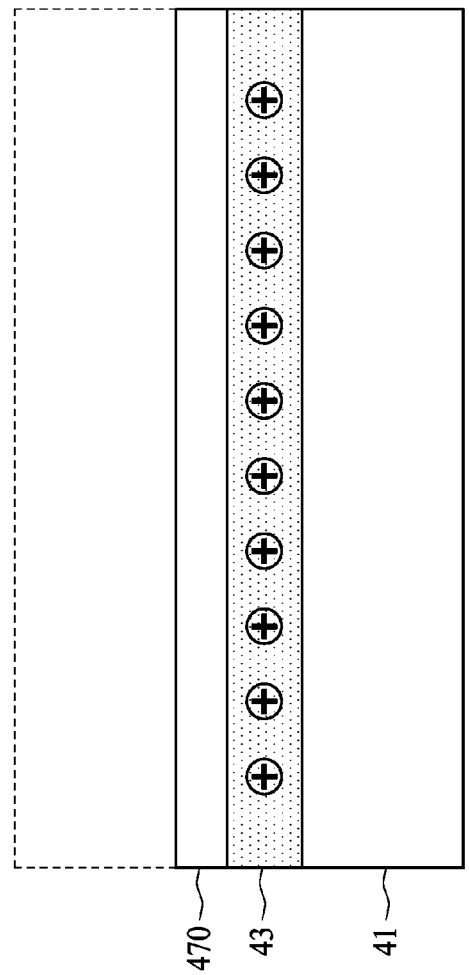

SEMICONDUCTOR DEVICE HAVING A CHARGED INSULATING LAYER

RELATED APPLICATION

This application claims priority to U.S. Provisional Application No. 62/011,835, filed on Jun. 13, 2014 and entitled "SEMICONDUCTOR DEVICE HAVING A CHARGED INSULATING LAYER." The application is incorporated herein by reference.

BACKGROUND

A significant trend throughout integrated circuit (IC) development is the downsizing of IC components. As the size reduces, the performance requirements become more stringent. As devices continue to shrink in size, the channel region and hence the gate length of gate electrode over the channel region also continue to shrink as well. For metal-oxide-semiconductor field effect transistors (MOSFETs), increased performance requirements have generally been met by aggressively scaling the length of the channel region. However, such a short channel length faces high electric field and manufacturing limits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3H are cross-sectional diagrams illustrating a method of forming a semiconductor device having a charged insulating layer in accordance with some embodiments.

FIGS. 4A to 4D are cross-sectional diagrams illustrating a method of forming a semiconductor device having a charged insulating layer in accordance with some embodiments.

DETAILED DESCRIPTION

Figure 1:
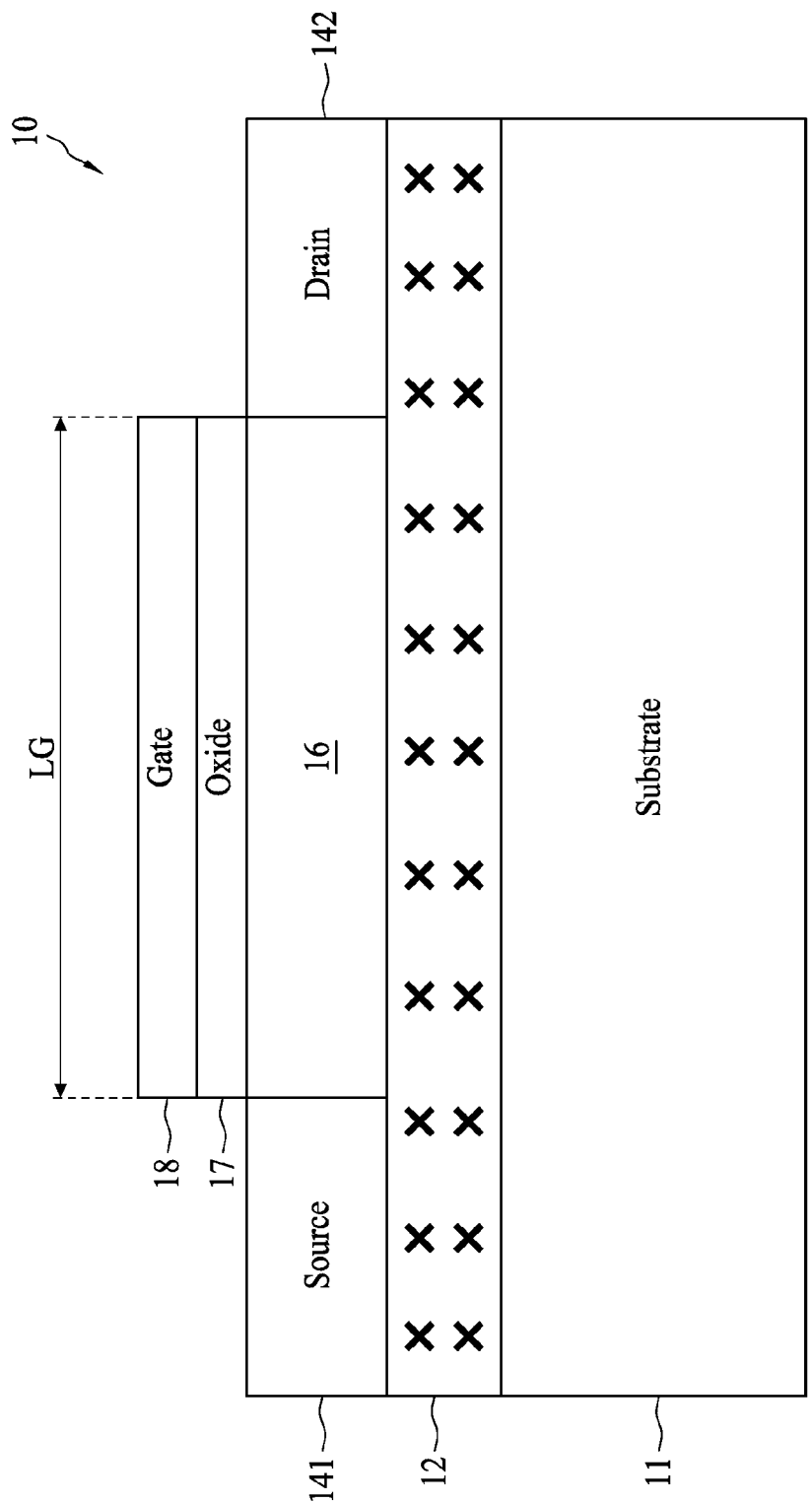
FIG. 1 is a schematic cross-sectional diagram of a semiconductor device having a charged insulating layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

FIG. 1 is a schematic cross-sectional diagram of a semiconductor device 10 having a charged insulating layer in accordance with some embodiments. Referring to FIG. 1, semiconductor device 10 includes a substrate 11, an insulating layer 12, a source region 141, a drain region 142, a channel region 16, a gate dielectric layer 17 and a metal layer 18. Semiconductor device 10 functions to serve as a metal-oxide-semiconductor (MOS) transistor. In some embodiments, semiconductor device 10 includes an ultra thin body (UTB) MOS transistor having a body thickness smaller than approximately four nanometers (nm).

Substrate 11 may comprise bulk silicon, doped or undoped. In some embodiments, substrate 11 includes a material selected from silicon, silicon-germanium, germanium, gallium arsenide or a combination thereof. For example, substrate 11 may be slightly doped with a p-type impurity such as aluminum, indium, gallium and boron. In some embodiments, concentration of the p-type impurity is approximately $10^{15}$ to $10^{17}$ cm$^{-3}$. Moreover, substrate 11 has a thickness ranging from approximately 500 to 600 micrometers (um).

Furthermore, substrate 11 may comprise an active layer of a silicon-on-insulator (SOI) substrate. Generally, an SOI substrate comprises a layer of a semiconductor material such as silicon, germanium, silicon germanium, SOI silicon germanium on insulator (SGOI), or combinations thereof. Other substrates that may be used include multi-layered substrates, gradient substrates, or hybrid orientation substrates. In addition, substrate 11 may include an epitaxial layer (epi layer), and may be strained for performance enhancement.

Insulating layer 12 includes a material selected from silicon oxide, silicon nitride ($Si_3N_4$) and aluminum oxide ($Al_2O_3$). When selected from silicon oxide, suitable materials may further include silicon dioxide ($SiO_2$), boron doped silicon glass (BSG), phosphorous doped silicon glass (PSG) and boron and phosphorous doped silicon glass (BPSG). Insulating layer 12 is disposed between substrate 11 and an active layer that comprises source region 141, drain region 142 and channel region 16, and is usually termed buried oxide (BOX) layer. In some embodiments, insulating layer 12 has a thickness ranging from approximately 5 to 15 nm. In an embodiment, the thickness of insulating layer 12 is approximately 10 nm.

Insulating layer 12 is doped with impurity. In an embodiment, semiconductor device 10 is a p-type MOS (PMOS) transistor, and insulating layer 12 is doped with p-type impurity or positive charge. Examples of the p-type dopant are boron and gallium. In another embodiment, semiconductor device 10 is an n-type MOS (NMOS) transistor, and insulating layer 12 is doped with n-type impurity or negative charge. Examples of the n-type dopant are arsenic, phosphorous and antimony. Ion-charged insulating layer 12 helps alleviate the short channel effects in UTB MOS transistors, as will be further discussed with reference to FIGS. 2A and 2B.

The active layer, comprising source region 141, drain region 142 and channel region 16, is disposed on insulating layer 12. Source region 141 and drain region 142 are disposed on opposite sides of channel region 16. The active layer is made of a material selected from silicon (Si), germanium (Ge), silicon phosphide (SiP), silicon carbide (SiC), germanium tin (GeSn) or suitable III-V semiconductors. In some embodiments, the thickness of the active layer ranges from approximately 2 to 3 nm. Source region 141 and drain region 142 in the active layer are interchangeable because current can flow from drain region 142 to source region 141, or vice versa, depending on whether voltage source VDD is applied to drain region 142 or source region 141.

In some embodiments, substrate 11 includes a silicon on insulator (SOI) wafer. In the SOI wafer structure, transistors are built on a silicon layer resting on an insulating layer of silicon dioxide ($SiO_2$). Moreover, the insulating layer is doped with positive charge or negative charge to alleviate short channel effects. Accordingly, the SOI wafer structure is different from existing ones, in which only a thin layer from a face of the wafer is used for making electronic components, and the rest essentially serves as mechanical support.

In an embodiment, semiconductor device 10 is a PMOS transistor, and source region 141 and drain region 142 are doped with p-type impurity having a concentration range of approximately $1 \times 10^{20}$ cm$^{-3}$ to $3 \times 10^{21}$ cm$^{-3}$. Moreover, channel region 16 is doped with n-type impurity having a concentration of approximately $10^{17}$ to $5 \times 10^{18}$ cm$^{-3}$.

In another embodiment, semiconductor device 10 is an NMOS transistor, and source region 141 and drain region 142 are doped with n-type impurity having a concentration range of approximately $1 \times 10^{20}$ cm$^{-3}$ to $3 \times 10^{21}$ cm$^{-3}$. Moreover, channel region 16 is doped with p-type impurity having a concentration of approximately $10^{17}$ to $5 \times 10^{18}$ cm$^{-3}$.

Gate dielectric layer 17 is disposed on the active layer over channel region 16. In some embodiments, gate dielectric layer 17 has an equivalent oxide thickness (EOT) ranging from approximately 0.5 to 1 nm. In an embodiment, the EOT of gate dielectric layer 17 is approximately 0.54 nm. Moreover, in some embodiments, gate dielectric 17 includes silicon dioxide or, in other embodiments, a high dielectric constant (K) material. In some embodiments, gate dielectric 17 includes a dielectric material based on silicon oxide, for example, silicon oxynitride, silicon oxide, or a stack of at least one silicon oxide and at least one silicon nitride. In some embodiments, gate dielectric 17 includes a dielectric metal oxide having a dielectric constant greater than 8.0, which is known as high-k dielectric materials. Exemplary high-k dielectric materials include $HfO_2$, $ZrO_2$, $La_2O_3$, $Al_2O_3$, $TiO_2$, $SrTiO_3$, $LaAlO_3$, $Al_2O_xN_y$, $Y_2O_3$, $LaAlO_xN_y$, $HfO_xN_y$, $ZrO_xN_y$, $La_2O_xN_y$, $TiO_xN_y$, $SrTiO_xN_y$, $Y_2O_xN_y$, and an alloy thereof. Each value of x is independently from 0.1 to 3.0 and each value of y is independently from 0.1 to 2.0.

Metal layer 18 serves as a gate electrode of semiconductor device 10 for local interconnection with other devices. In some embodiments, metal layer 18 includes standard polysilicon. In other embodiments, metal layer 18 includes amorphous polysilicon material, a metal material, silicided metal material, or a stack of at least one metallic material and at least one semiconductor material. Gate electrode 18 has a physical gate length (labeled LG) ranging from approximately 7 to 20 nm. In an embodiment, the physical gate length of gate electrode 18 is approximately 10.6 nm.

Figure 2A:
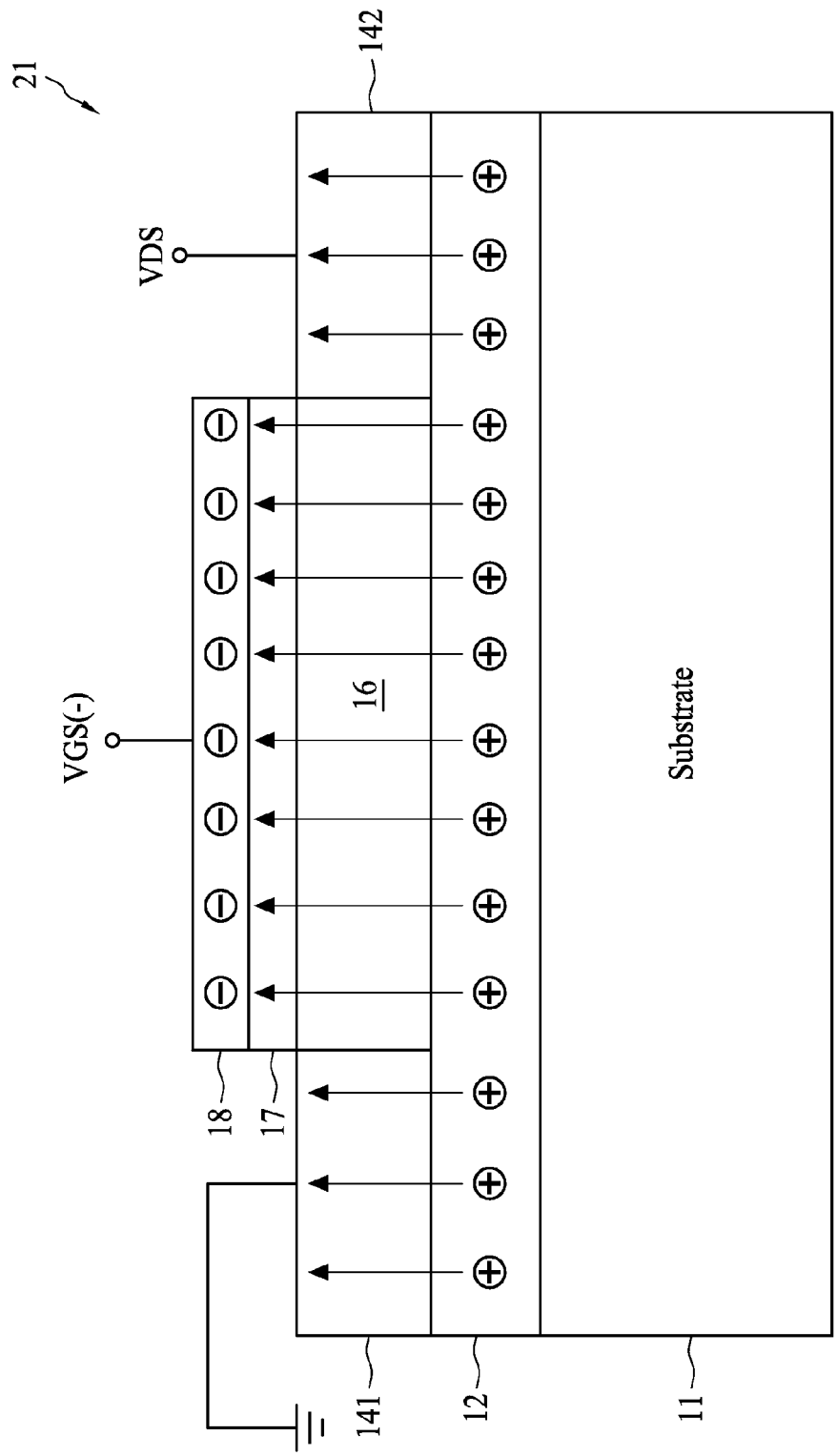
FIG. 2A is a diagram of a semiconductor device having a positively charged insulating layer in accordance with some embodiments.

FIG. 2A is a diagram of a semiconductor device 21 having a positively charged insulating layer in accordance with some embodiments. Referring to FIG. 2A, semiconductor device 21 is similar in structure to semiconductor device 10 described and illustrated with reference to FIG. 1. Semiconductor device 21 is a PMOS transistor, and includes insulating layer 12 doped with positive charge. In some embodiments, concentration of the positive charge ranges from approximately $1 \times 10^{12}$ cm$^{-3}$ to $5 \times 10^{13}$ cm$^{-3}$. In some embodiments, concentration of the positive charge ranges from approximately $4 \times 10^{12}$ cm$^{-3}$ to $10 \times 10^{12}$ cm$^{-3}$. Furthermore, the positive charge may include but is not limited to $B^+$, $B^{2+}$, $BF^+$, $BF_2^+$, $P^{2+}$, $P^{3+}$, $P_2^+$ and $P_3^+$.

In operation, when semiconductor device 21 is connected to power supply, due to the nature of PMOS transistor, gate to source voltage VGS is negative and gate electrode 18 can be deemed negatively charged. As a result, an electric field (shown in arrowhead lines) is established between insulating layer 12 and gate electrode 18. The electric field is outward from the positive charge in insulating layer 12 across the active layer towards gate electrode 18.

Figure 2B:
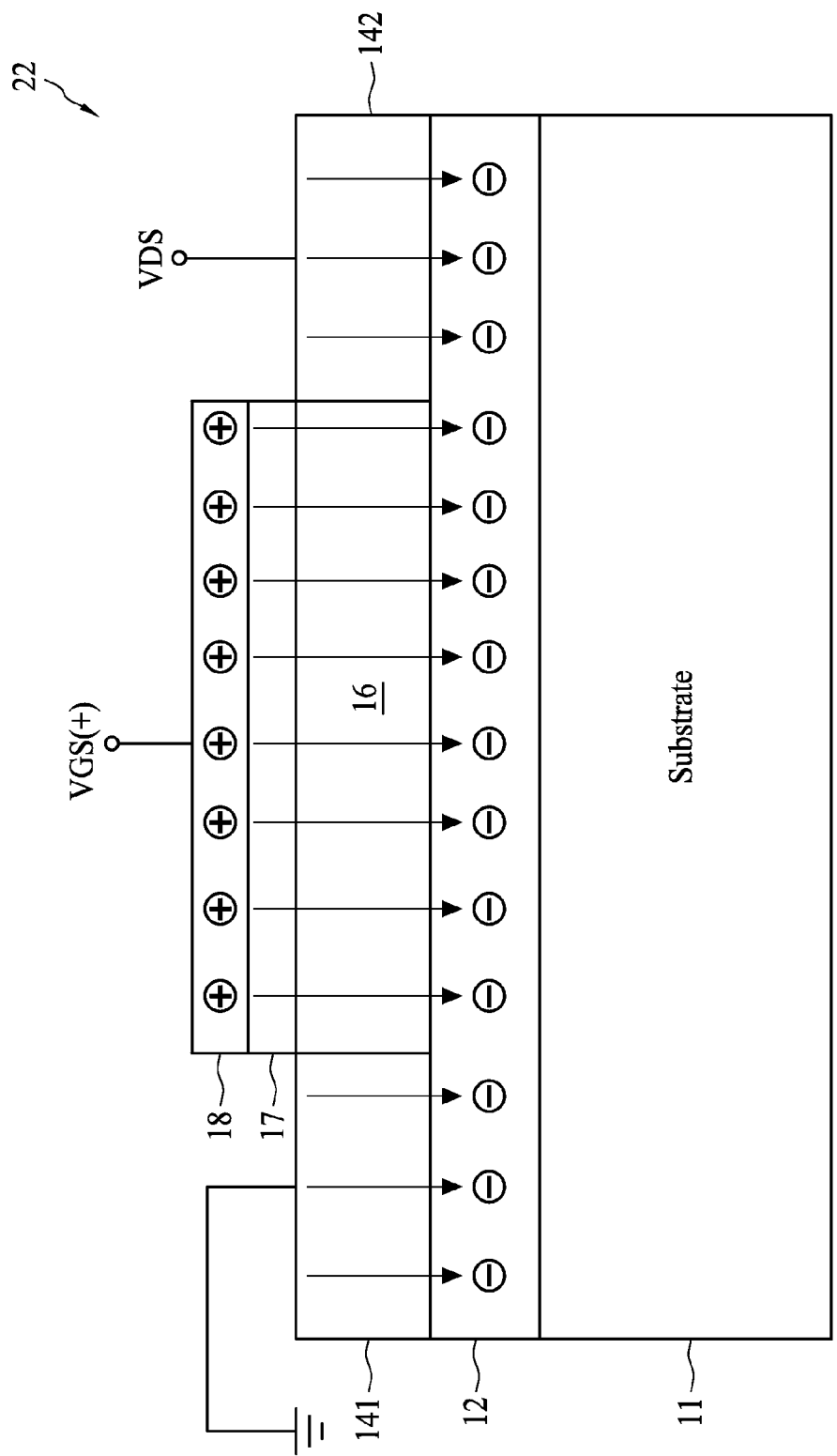
FIG. 2B is a diagram of a semiconductor device having a negatively charged insulating layer in accordance with some embodiments.

FIG. 2B is a diagram of a semiconductor device 22 having a negatively charged insulating layer in accordance with some embodiments. Referring to FIG. 2B, semiconductor device 22 is similar in structure to semiconductor device 10 described and illustrated with reference to FIG. 1. Semiconductor device 22 is an NMOS transistor, and includes insulating layer 12 doped with negative charge. In some embodiments, concentration of the negative charge ranges from approximately $1 \times 10^{12}$ cm$^{-3}$ to $5 \times 10^{13}$ cm$^{-3}$. Furthermore, the negative charge may include but is not limited to $C^-$, $C_2^-$, $B_2^-$, $P^-$, $Si^-$, $Cu^-$, $Ag^-$, $Au^-$, $O^-$, $F^-$ and $CN^-$.

In operation, when semiconductor device 22 is connected to power supply, due to the nature of NMOS transistor, gate to source voltage VGS is positive and gate electrode 18 can be deemed positively charged. As a result, an electric field is established between insulating layer 12 and gate electrode 18. The electric field is outward from gate electrode 18 across the active layer towards the negative charge in insulating layer 12.

With the charged insulating layer 12, semiconductor devices 21 and 22 can act like a double-gate device, in which gate electrode 18 serves as a first gate controlled by applied voltage, and insulating layer 12 serves as a second gate controlled by charged ions.

For transistors such as UTB MOS transistors, as the physical gate length is scaled down, the performance of UTB MOS transistors is degraded due to the undesirable short-channel effects. With the charged insulating layer 12, short-channel effects such as drain-induced barrier lowering (DIBL) effect and sub-threshold slope (SS) degradation are alleviated.

FIGS. 3A to 3H are cross-sectional diagrams illustrating a method of forming a semiconductor device 30 having a charged insulating layer in accordance with some embodiments. Referring to FIG. 3A, a first substrate 31 is provided. First substrate 31 may be slightly doped with a p-type impurity such as aluminum, indium, gallium and boron. In some embodiments, concentration of the p-type impurity is approximately $10^{15}$ to $10^{17}$ cm$^{-3}$. Moreover, first substrate 11 has a thickness ranging from approximately 500 to 600 micrometers (um).

Referring to FIG. 3B, an insulating layer 32 is grown in first substrate 31 by, for example, a thermal process. In some embodiments, insulating layer 32 includes silicon oxide such as silicon dioxide ($SiO_2$).

Referring to FIG. 3C, a second substrate 37 is provided. Second substrate 37 is doped with positive charge by, for example, an ion implantation process. In some embodiments, positive charge is delivered in a positive implantation by ion beams of, for example, $B^+$, $B^{2+}$, $BF^+$, $BF_2^+$, $P^{2+}$, $P^{3+}$, $P_2^+$ and $P_3^+$. The implanted dose is approximately $5\times10^{10}$ to $5\times10^{12}$ cm$^{-2}$ at implantation energy from 0.5 to 3 kilovolts (kV). Moreover, concentration of the positive charge ranges from approximately $1\times10^{12}$ cm$^{-3}$ to $5\times10^{13}$ cm$^{-3}$. In some embodiments, concentration of the positive charge ranges from approximately $4\times10^{12}$ cm$^{-3}$ to $10\times10^{12}$ cm$^{-3}$.

In some embodiments, second substrate 37 may be doped with negative charge. Negative charge is delivered in a negative implantation by ion beams of, for example, $C^-$, $C_2^-$, $B_2^-$, $P^-$, $Si^-$, $Cu^-$, $Ag^-$, $Au^-$, $O^-$, $F^-$ and $CN^-$. The implanted dose is approximately $5\times10^{10}$ to $5\times10^{12}$ cm$^{-2}$ at implantation energy from 0.5 to 3 kilovolts (kV). Moreover, concentration of the negative charge ranges from approximately $1\times10^{12}$ cm$^{-3}$ to $5\times10^{13}$ cm$^{-3}$. In some embodiments, concentration of the positive charge ranges from approximately $4\times10^{12}$ cm$^{-3}$ to $10\times10^{12}$ cm$^{-3}$.

Referring to FIG. 3D, first substrate 31 and second substrate 37 are integrated by bonding together insulating layer 32 of first substrate 31 and charged surface 38 of second substrate 37, followed by a thermal process, resulting in a charged insulating layer 33, as illustrated in FIG. 3E. Referring to FIG. 3E, a semiconductor layer 370 for subsequently making electronic components is formed by removing a portion (shown in dashed lines) of second substrate 37, followed by, for example, a chemical mechanical polish (CMP) process. In some embodiments, the thickness of semiconductor layer 370 ranges from approximately 2 to 3 nm.

Next, referring to FIG. 3F, a patterned photoresist layer 35 is formed on semiconductor layer 370 by a lithography process, exposing portions of semiconductor layer 370 where source and drain regions are to be defined. Subsequently, the exposed portions of semiconductor layer 370 are subjected to an implantation source in an implantation process.

Referring to FIG. 3G, a source region S and a drain region D are defined in semiconductor layer 370. Patterned photoresist layer 35 is then removed. Afterwards, patterned photoresist layer 36 is formed on semiconductor layer 370 by a lithography process, exposing a portion of semiconductor layer 370 where channel region is to be defined. Subsequently, the exposed portion of semiconductor layer 370 is subjected to an implantation source in an implantation process.

Referring to FIG. 3H, a channel region C is defined between source region S and drain region D in semiconductor layer 370. Patterned photoresist layer 36 is then removed. Afterwards, a gate dielectric layer 39 is formed on semiconductor layer 370 over channel region C by, for example, a deposition process. Subsequently, a gate electrode G is formed on gate dielectric layer 39 over channel region C by, for example, a deposition process. In some embodiments, gate dielectric layer 39 includes silicon dioxide or, in other embodiments, a high dielectric constant (K) material. Moreover, gate electrode G includes a material selected from polysilicon, amorphous polysilicon, metal, silicided metal, or a stack of at least one metallic material and at least one semiconductor material.

Source region S and drain region D are doped with a dopant having the same dopant type as charged insulating layer 33. In the present embodiment, semiconductor device 30 is a PMOS transistor, and source region S and drain region D are doped with p-type impurity having a concentration range of approximately $1\times10^{20}$ cm$^{-3}$ to $3\times10^{21}$ cm$^{-3}$. P-type doping creates an abundance of electric holes (positive charge) by removing weakly bound outer electrons from host semiconductor material's atoms when chemically bonded with them. The electric holes can enhance conductivity by acting as additional charge carriers.

Moreover, channel region C is doped with n-type impurity having a concentration of approximately $10^{17}$ to $5\times10^{18}$ cm$^{-3}$. N-type doping creates an abundance of free electrons (negative charge) when bonding with the host semiconductor material. The free electrons also enhance conductivity.

In another embodiment, semiconductor device 30 is an NMOS transistor, and source region S and drain region D are doped with n-type impurity having a concentration range of approximately $1\times10^{20}$ cm$^{-3}$ to $3\times10^{21}$ cm$^{-3}$. Moreover, channel region 16 is doped with p-type impurity having a concentration of approximately $10^{17}$ to $5\times10^{18}$ cm$^{-3}$.

FIGS. 4A to 4D are cross-sectional diagrams illustrating a method of forming a semiconductor device having a charged insulating layer in accordance with some embodiments. Referring to FIG. 4A, a first substrate 41 is provided. First substrate 41 is similar to first substrate 31 described and illustrated with reference to FIG. 3A. An insulating layer 42 is then formed on first substrate 41 by, for example, a deposition process. Afterwards, insulating layer 42 is subjected to an implantation source in an implantation process, resulting in a charged insulating layer 43, as illustrated in FIG. 4B.

Referring to FIG. 4C, a second substrate 47 similar to first substrate 41 is provided. Second substrate 47 is the bonded to charged insulating layer 42 of first substrate 41.

Next, referring to FIG. 4D, a semiconductor layer 470 for subsequently making electronic components is formed by removing a significant portion (shown in dashed lines) of second substrate 47, followed by, for example, a CMP process. In some embodiments, the thickness of semiconductor layer 470 ranges from approximately 2 to 3 nm. The remaining processes for defining source, drain and channel regions, and forming gate dielectric layer and gate electrode are similar to those described and illustrated with reference to FIGS. 3F to 3H and thus are not further discussed.

Figure 5:
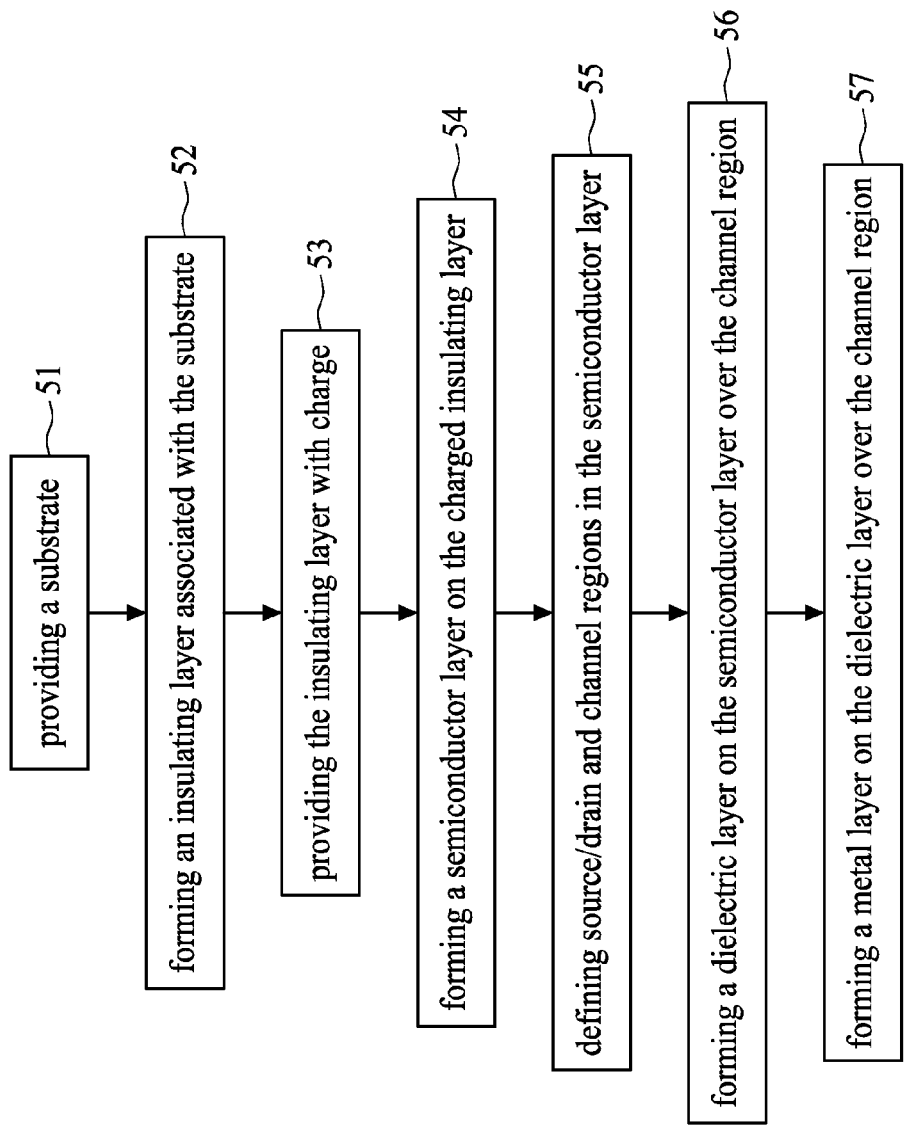
FIG. 5 is a flow diagram illustrating a method of forming a semiconductor device having a charged insulating layer in accordance with some embodiments.

FIG. 5 is a flow diagram illustrating a method of forming a semiconductor device having a charged insulating layer in accordance with some embodiments. Referring to FIG. 5, in operation 51, a substrate is provided. The substrate is similar to first substrate 31 or first substrate 41 described and illustrated with reference to FIG. 3A or 4A, respectively.

In operation 52, an insulating layer associated with the substrate is formed. The insulating layer in an embodiment is formed in the substrate by a thermal process, or formed on the substrate by a deposition process.

Next, the insulating layer is provided with charge in operation 53, resulting in a charged insulating layer. In an embodiment, also referring to FIG. 3C, another substrate is provided and doped with dopant of a first dopant type. These substrates are integrated by bonding the insulating layer and the doped layer, followed by a thermal process. In another embodiment, also referring to FIG. 4A, the insulating layer associated with the substrate is doped with dopant of the first dopant type.

In operation 54, a semiconductor layer is formed on the charged insulating layer. In an embodiment, also referring to FIG. 3E, the semiconductor layer is formed by removing a portion of the other substrate as described in operation 53 after the bonding process. In another embodiment, another substrate is provided and then bonded to the charged insulating layer, as illustrated in FIG. 4C. Subsequently, a portion of the other substrate is removed after the bonding process, as illustrated in FIG. 4D.

In operation 55, source, drain and channel regions are defined in the semiconductor layer. The source and drain regions are doped with dopant of the first dopant type, while the channel region is doped with dopant of a second dopant type. In an embodiment, the semiconductor device under fabrication is a PMOS transistor and the charged insulating layer, source region and drain region are doped with p-type impurity. In another embodiment, the semiconductor device under fabrication is an NMOS transistor and the charged insulating layer, source region and drain region are doped with n-type impurity.

In operation 56, a dielectric layer is formed on the semiconductor layer by, for example, a deposition process. The dielectric layer is then patterned to form the gate dielectric of the semiconductor device. The patterned dielectric layer is disposed over the channel region. In some embodiments, the patterned dielectric layer includes silicon dioxide or a high-K material.

Next, in operation 57, a metal layer is formed on the semiconductor layer and the patterned dielectric layer by, for example, a deposition process. The metal layer is then patterned to form the gate structure for the semiconductor device. The patterned metal layer is disposed on the patterned dielectric layer over the channel region. In some embodiments, the patterned metal layer includes a material selected from polysilicon, amorphous polysilicon, metal, silicided metal, or a stack of at least one metallic material and at least one semiconductor material.

Figure 6A:
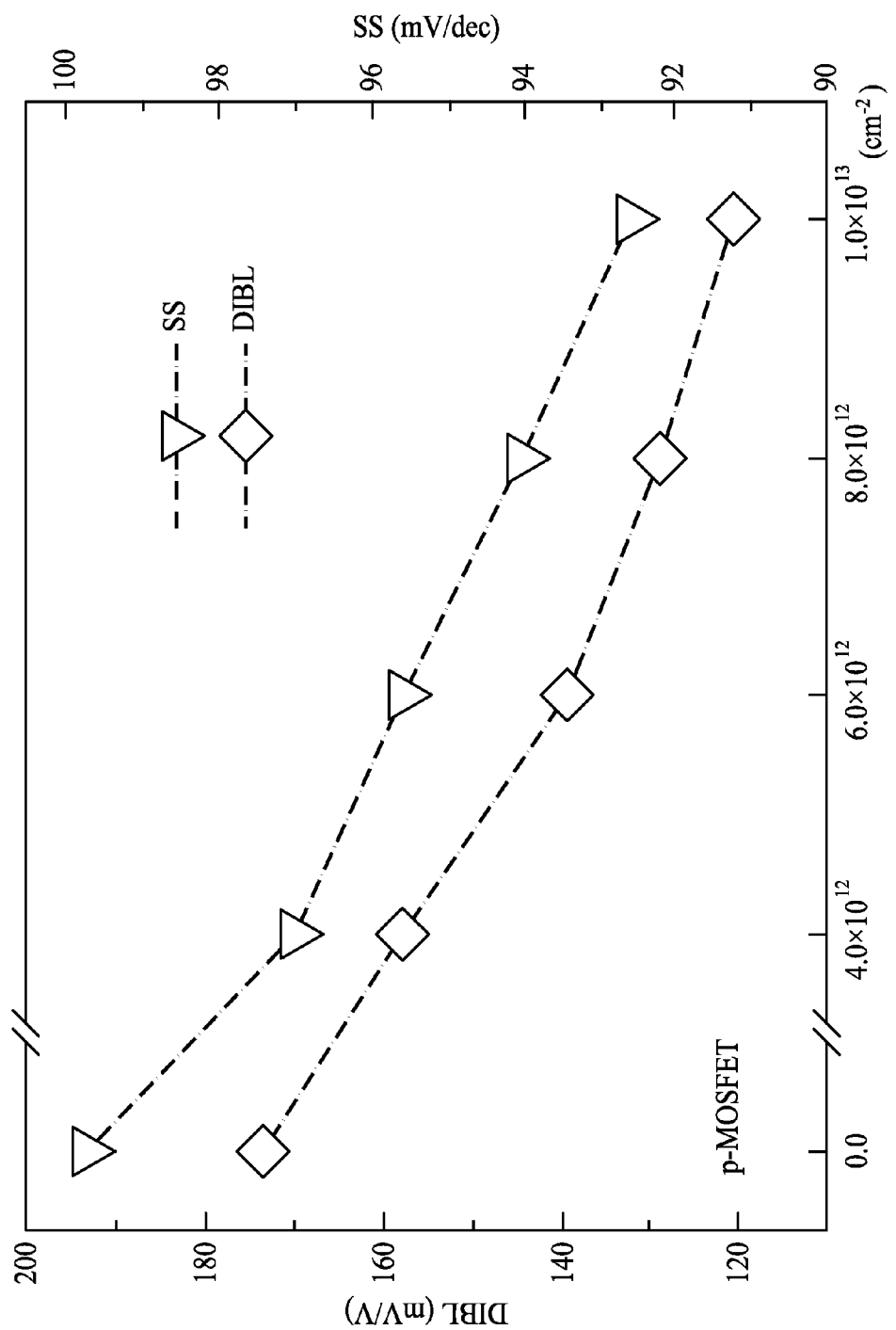
FIGS. 6A and 6B are graphs showing the relationship between the concentration of a doped buried oxide (BOX) layer and short-channel-effect (SCE) factors.
Figure 6B:
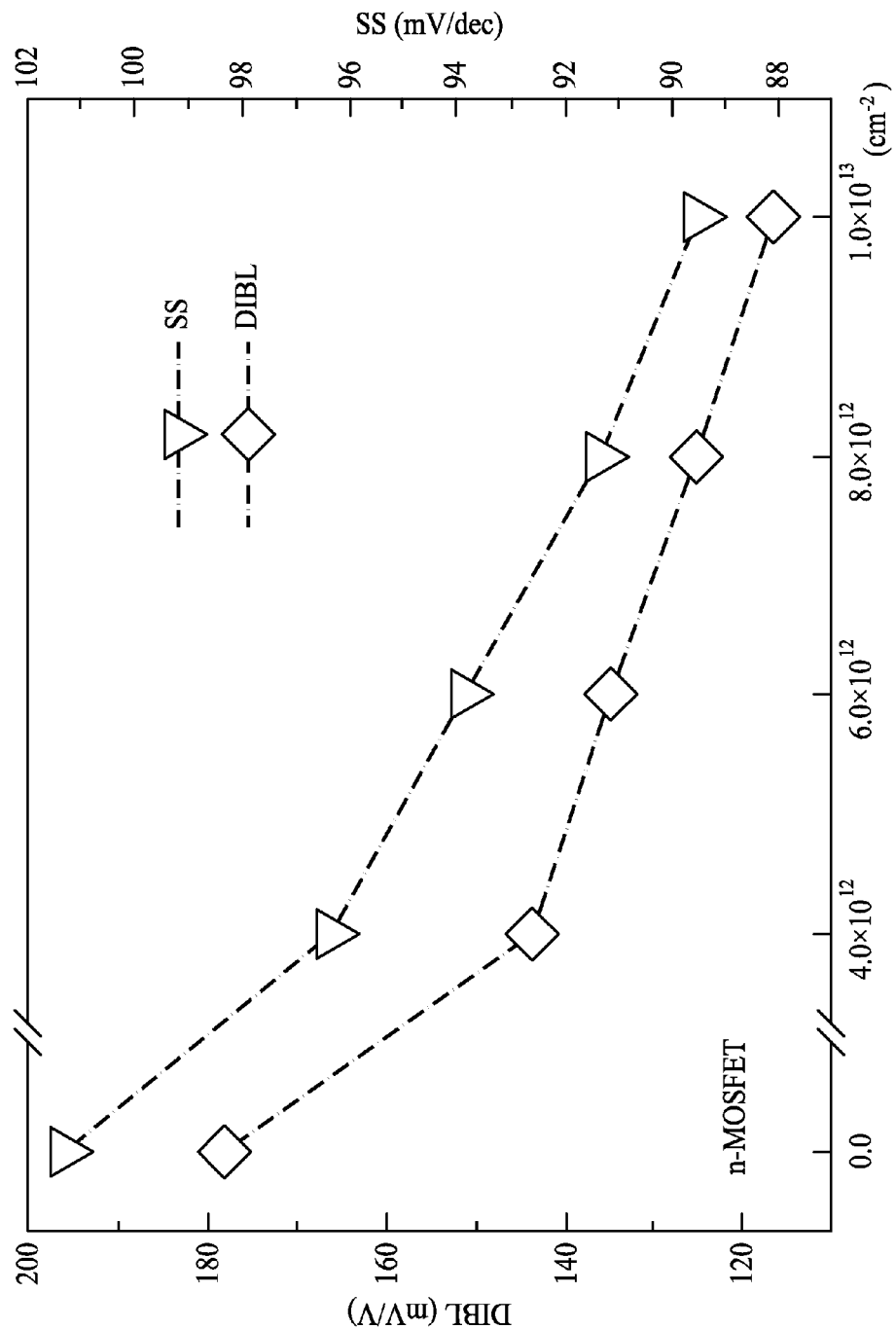

FIGS. 6A and 6B are graphs showing the relationship between the concentration of a doped buried oxide (BOX) layer and short-channel-effect (SCE) factors. Referring to FIG. 6A, the horizontal axis represents the concentration of positive charge in a doped BOX layer of a PMOS transistor, the right vertical axis represents the level of drain-induced barrier lowering (DIBL) effect (shown in a square-and-dash curve), and the left vertical axis represents the level of sub-threshold slope (SS) degradation (shown in a triangle-and-dash curve). DIBL effect and SS degradation, caused by short channel effects, are undesirable factors in a transistor. The experiment results shown in FIG. 6A reveal that both DIBL and SS levels decrease as the concentration of doped positive charge increases. Accordingly, a positively doped BOX layer facilitates alleviation of the SCE issue with a PMOS transistor.

Referring to FIG. 6B, the horizontal axis represents the concentration of negative charge in a doped BOX layer of an NMOS transistor, while the vertical axes represent the same as those in FIG. 6A. Similarly, the experiment results shown in FIG. 6B reveal that both DIBL and SS levels decrease as the concentration of doped negative charge increases. Accordingly, a negatively doped BOX layer facilitates alleviation of the SCE issue with an NMOS transistor.

Figure 7:
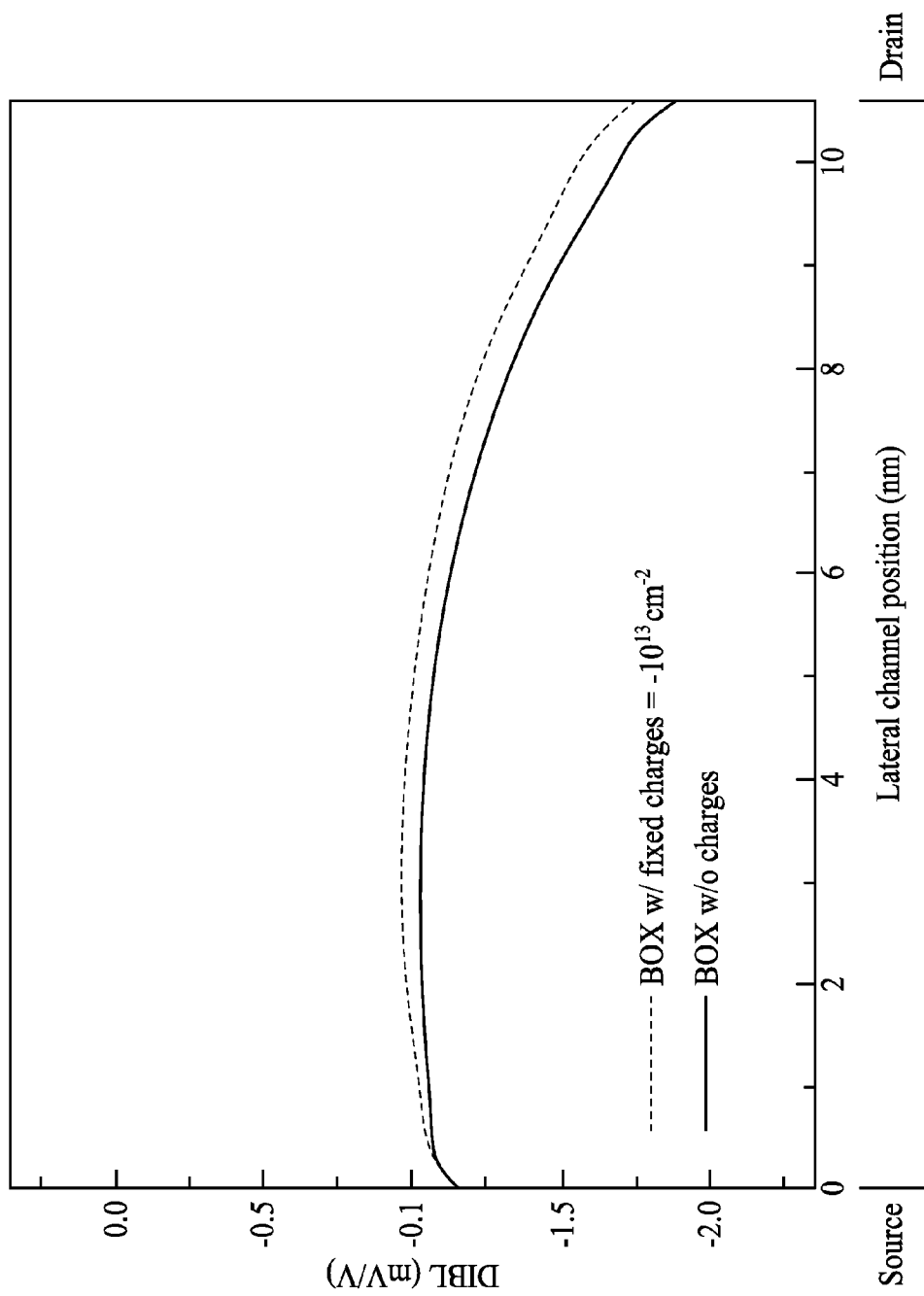
FIG. 7 is a graph showing energy barrier levels across a channel region with respect to doped and undoped BOX layers.

FIG. 7 is a graph showing energy barrier levels across a channel region with respect to doped and undoped BOX layers. Referring to FIG. 7, the horizontal axis represents lateral channel position, and the vertical axis represents energy barrier level. For UTB transistors, a higher energy barrier level exhibits better performance against DIBL and SS effects. The experiment results shown in FIG. 7 reveal that a doped BOX layer (shown in a dashed curve) enjoys a higher barrier level than an undoped BOX layer (shown in a solid curve).

Figure 8:
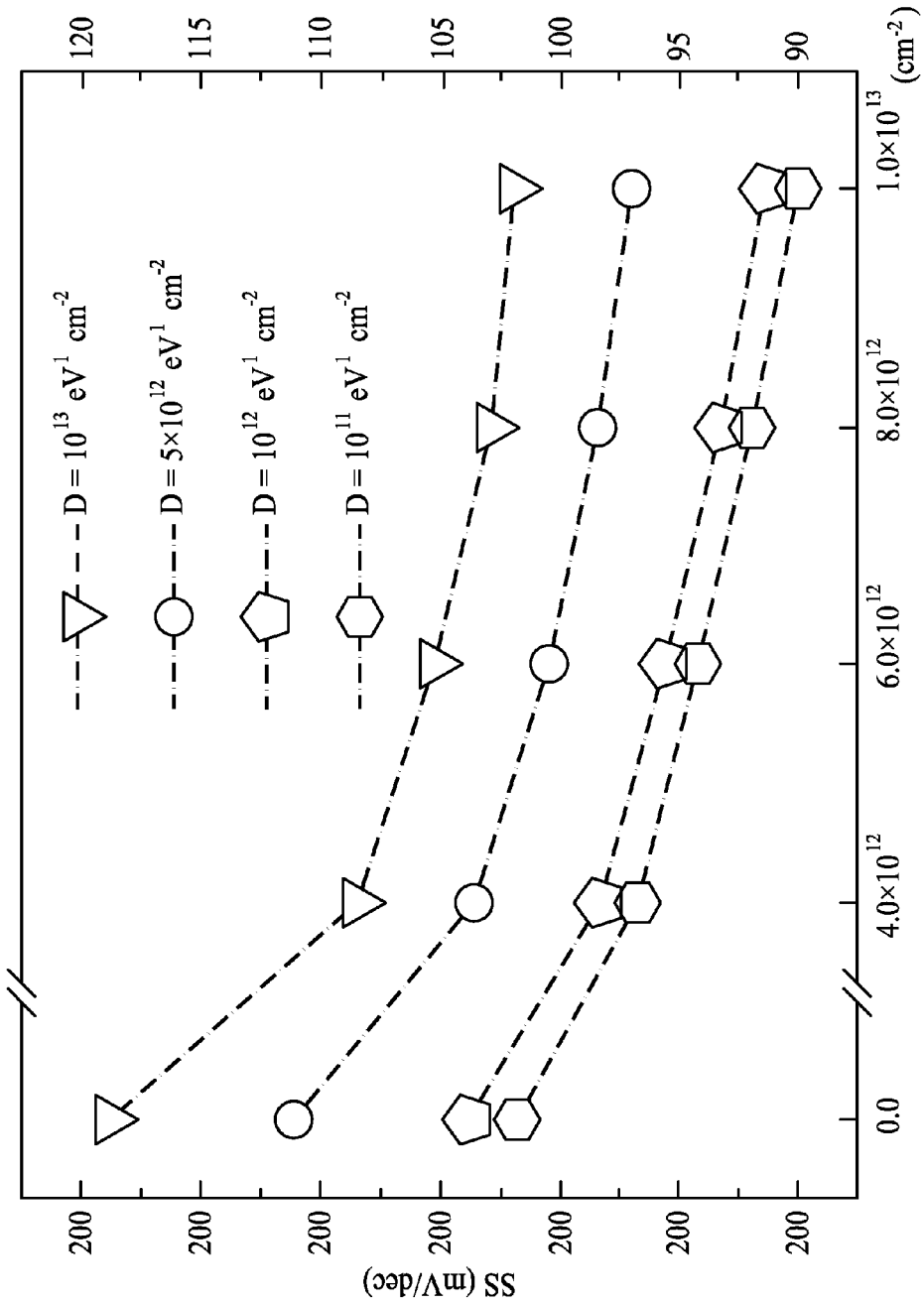
FIG. 8 is a graph showing the relationship between the concentration of a doped BOX layer and sub-threshold slope (SS) degradation at various interface trap densities.

FIG. 8 is a graph showing the relationship between the concentration of a doped BOX layer and sub-threshold slope (SS) degradation at various interface trap densities. Referring to FIG. 8, the horizontal axis represents the concentration of, for example, negative charge in a doped BOX layer, and the vertical axis represents SS level. Generally, a higher interface trap density results in more severe SS degradation, which is undesirable. FIG. 8 shows that the SS level each at four interface densities decreases as the concentration of the doped charge increases. Accordingly, a doped BOX layer alleviates the SCE issue at various interface trap densities.

Figure 9:
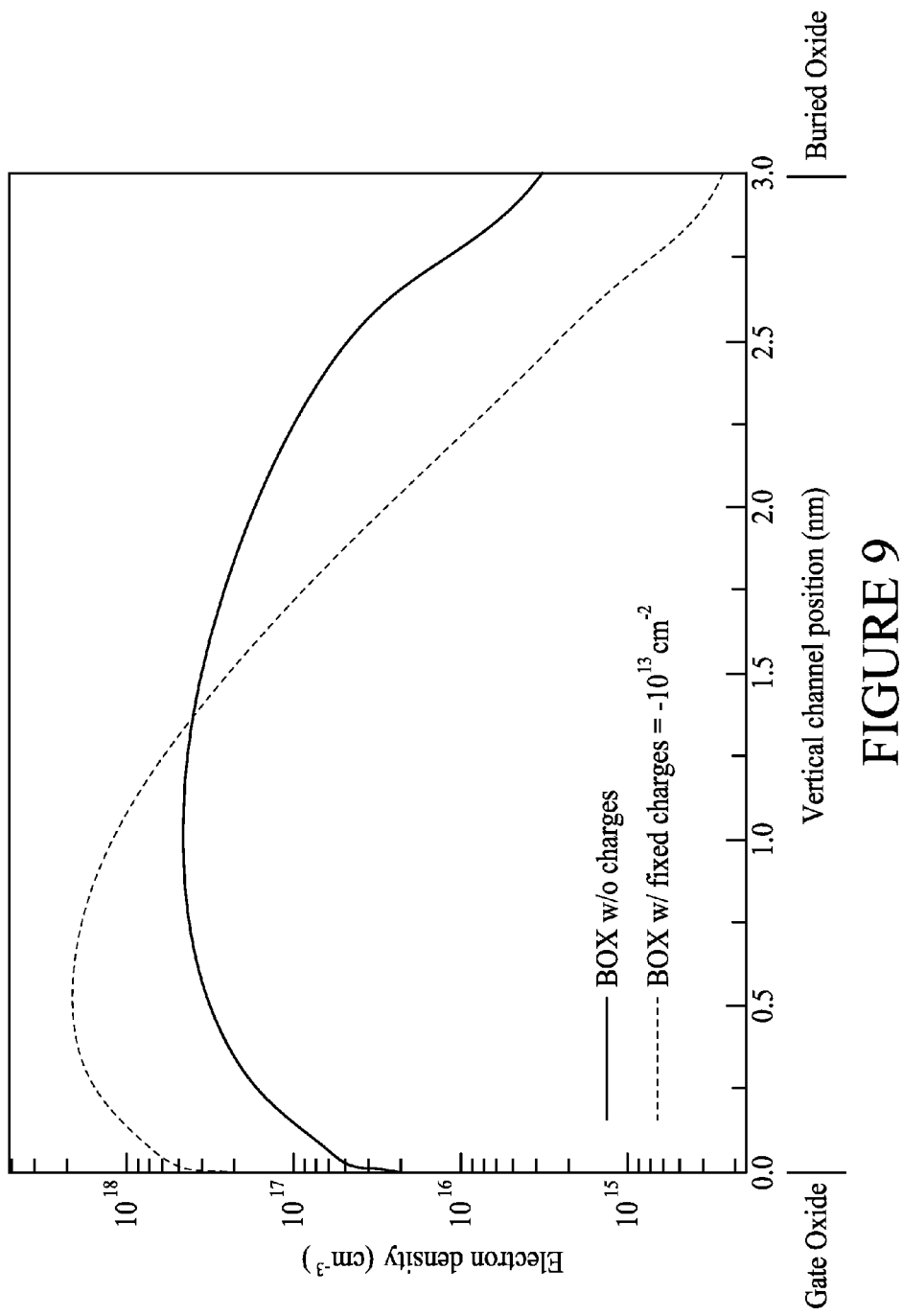
FIG. 9 is a graph showing electron density at various vertical channel positions with respect to doped and undoped BOX layers.

FIG. 9 is a graph showing electron density at various vertical channel positions with respect to doped and undoped BOX layers. Referring to FIG. 9, the horizontal axis represents vertical channel position, and the vertical axis represents electron density. As compared to an undoped BOX layer, a doped BOX layer has a sharper slope curve. Carriers are more easily pushed toward the gate oxide in the doped BOX structure. As a result, the gate control ability of a transistor with the doped BOX layer is enhanced.

Figure 10A:
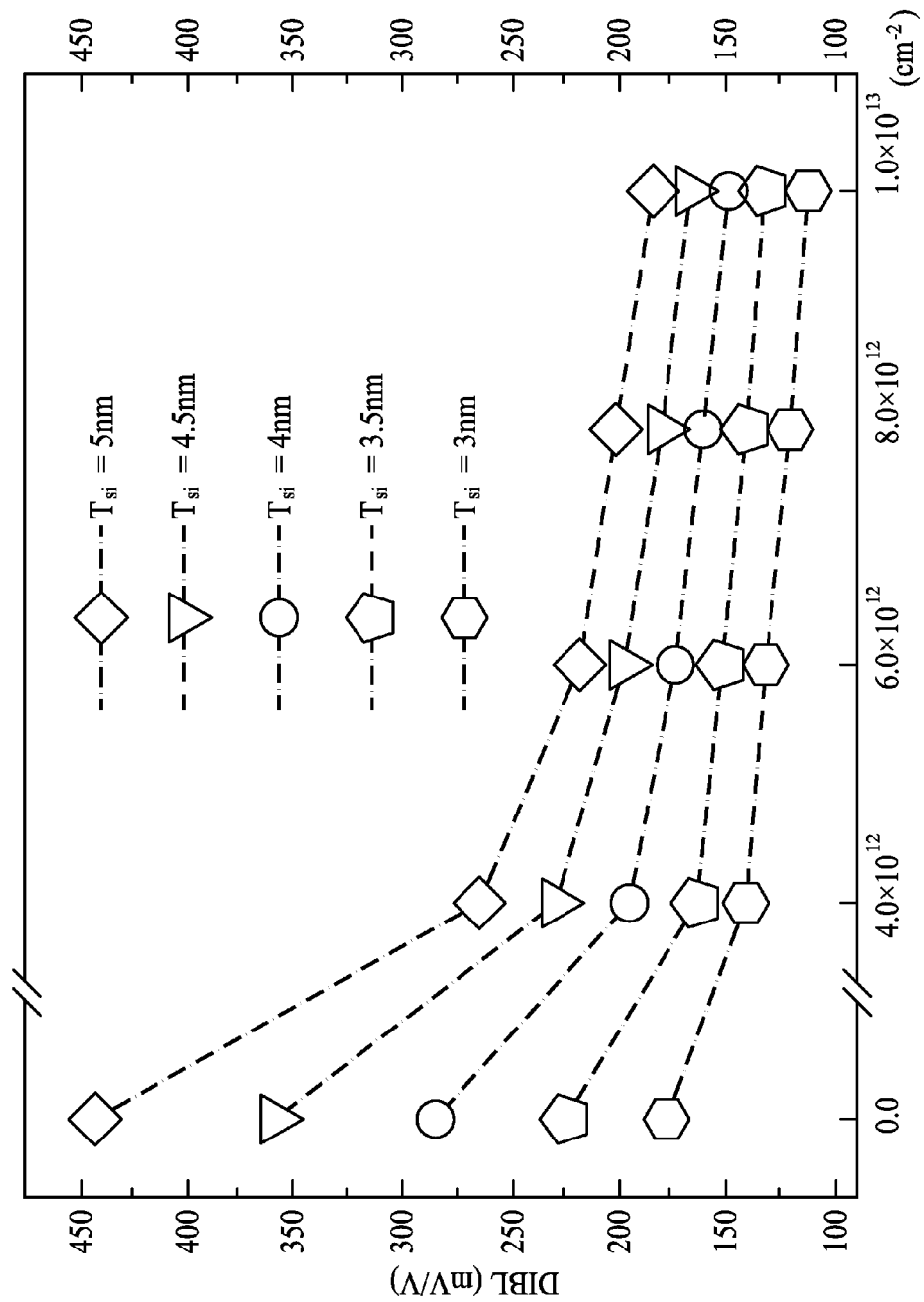
FIG. 10A is a graph showing the relationship between the concentration of a doped BOX layer and drain-induced barrier lowering (DIBL) effect with respect to channel thickness.

FIG. 10A is a graph showing the relationship between the concentration of a doped BOX layer and drain-induced barrier lowering (DIBL) effect with respect to channel thickness. Referring to FIG. 10A, the horizontal axis represents the concentration of, for example, negative charge in a doped BOX layer, and the vertical axis represents the DIBL level. Generally, a larger channel thickness results in more severe DIBL effect. FIG. 10A demonstrates that the DIBL level at different channel thicknesses decreases as the concentration of the doped charge increases. Moreover, given a certain desired DIBL level, for example, 175 mV/V as indicated in FIG. 10A, a smaller channel thickness requires a lower doped concentration than a larger channel thickness.

Figure 10B:
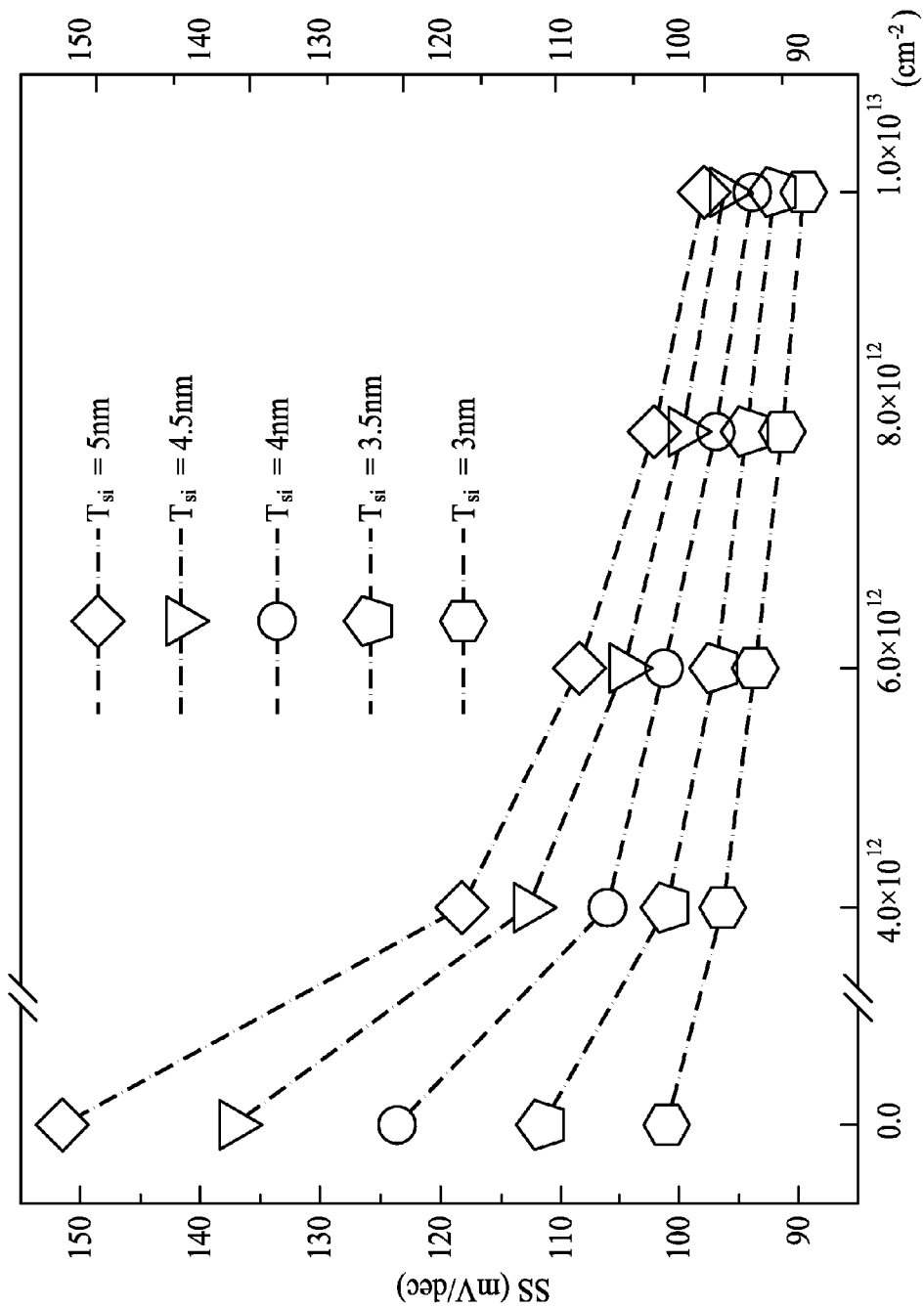
FIG. 10B is a graph showing the relationship between the concentration of a doped BOX layer and sub-threshold slope (SS) degradation with respect to channel thickness.

FIG. 10B is a graph showing the relationship between the concentration of a doped BOX layer and sub-threshold slope (SS) degradation with respect to channel thickness. Referring to FIG. 10B, the horizontal axis represents the concentration of, for example, negative charge in a doped BOX layer, and the vertical axis represents the SS level. Generally, a larger channel thickness results in more severe SS degradation. FIG. 10B demonstrates that the SS level at different channel thicknesses decreases as the concentration of the doped charge increases. Moreover, given a certain desired SS level, for example, 102 mV/dec as indicated in FIG. 10B, a smaller channel thickness requires a lower doped concentration than a larger channel thickness.

Embodiments of the present disclosure provide a semiconductor device. The semiconductor device comprises a substrate, an active layer over the substrate, and an insulating layer between the substrate and the active layer. The insulating layer is doped with one of positive charge and negative charge and is configured to establish an electric field across the active layer when the semiconductor device is powered.

In an embodiment, the insulating layer includes a material selected from silicon oxide, silicon nitride ($Si_3N_4$) and aluminum oxide ($Al_2O_3$).

In another embodiment, the insulating layer includes a material selected from silicon dioxide ($SiO_2$), boron doped silicon glass (BSG), phosphorous doped silicon glass (PSG) and boron and phosphorous doped silicon glass (BPSG).

In yet another embodiment, the positive charge has a concentration ranging from $1 \times 10^{12}$ $cm^{-3}$ to $5 \times 10^{13}$ $cm^{-3}$.

In still another embodiment, the positive charge has a concentration ranging from $4 \times 10^{12}$ $cm^{-3}$ to $10 \times 10^{12}$ $cm^{-3}$.

In still another embodiment, the negative charge has a concentration ranging from $1 \times 10^{12}$ $cm^{-3}$ to $5 \times 10^{13}$ $cm^{-3}$.

In still another embodiment, the negative charge has a concentration ranging from $4 \times 10^{12}$ $cm^{-3}$ to $10 \times 10^{12}$ $cm^{-3}$.

In yet still another embodiment, the active layer includes a source region, a drain region, and a channel region between the source region and the drain region. Moreover, the source and drain regions have a same dopant type as the insulating layer, and the channel region has a different dopant type from the insulating layer.

Some embodiments of the present disclosure provide a transistor. The transistor comprises a substrate, an insulating layer associated with the substrate, and a source region, a drain region and a channel region on the insulating layer. The insulating layer is grown in the substrate by a thermal process, or deposited on the substrate by a deposition process. Moreover, the insulating layer includes dopant of a first dopant type. The source and drain regions also include dopant of the first dopant type, while the channel region includes dopant of a second dopant type. The transistor further includes a gate electrode over the channel region. The gate electrode and the insulating layer establish an electric field therebetween when the transistor is powered.

In an embodiment, dopant of one of the first and second dopant types includes $B^+$, $B^{2+}$, $BF^+$, $BF_2^+$, $P^{2+}$, $P^{3+}$, $P_2^+$ and $P_3^+$. Furthermore, dopant of the other one of the first and second dopant types includes $C^-$, $C_2^-$, $B_2^-$, $P^-$, $Si^-$, $Cu^-$, $Ag^-$, $Au^-$, $O^-$, $F^-$ and $CN^-$.

Embodiments of the present disclosure provide a method of manufacturing a semiconductor device. The method comprises providing a substrate, forming an insulating layer associated with the substrate, providing the insulating layer with charge of a first dopant type, forming a semiconductor layer on the charged insulating layer, and defining a source region of the first dopant type and a drain region of the first dopant type in the semiconductor layer.

In providing the insulating layer with charge, in an embodiment, also referring to FIG. 3C, another substrate is provided and doped with dopant of a first dopant type. These substrates are integrated by bonding the insulating layer and the doped layer, followed by a thermal process.

In providing the insulating layer with charge, in another embodiment, also referring to FIG. 4A, the insulating layer associated with the substrate is doped with dopant of the first dopant type.

The above description includes exemplary operations, but these operations are not necessarily required to be performed in the order shown. Operations may be added, replaced, changed order, skipped, and/or eliminated as appropriate, in accordance with the spirit and scope of the disclosure. Accordingly, the scope of the disclosure should be determined with reference to the following claims, along with the full scope of equivalences to which such claims are entitled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   an active layer over the substrate; and
   an insulating layer between the substrate and the active layer, the insulating layer being doped with one of positive charge and negative charge and configured to establish an electric field across the active layer when the semiconductor device is powered;
   wherein the active layer includes a source region, a drain region, and a channel region between the source region and the drain region; and
   wherein the source and drain regions have a same dopant type as the insulating layer, and the channel region has a different dopant type from the insulating layer.

2. The semiconductor device of claim 1, wherein the insulating layer includes a material selected from silicon oxide, silicon nitride ($Si_3N_4$) and aluminum oxide ($Al_2O_3$).

3. The semiconductor device of claim 1, wherein the insulating layer includes a material selected from silicon dioxide ($SiO_2$), boron doped silicon glass (BSG), phosphorous doped silicon glass (PSG) and boron and phosphorous doped silicon glass (BPSG).

4. The semiconductor device of claim 1, wherein the positive charge has a concentration ranging from $1 \times 10^{12}$ $cm^{-3}$ to $5 \times 10^{13}$ $cm^{-3}$.

5. A transistor, comprising:
   a substrate;
   an insulating layer associated with the substrate, the insulating layer including dopant of a first dopant type;
   a source region of the first dopant type on the insulating layer;
   a drain region of the first dopant type on the insulating layer;
   a channel region of a second dopant type between the source region and the drain region on the insulating layer; and
   a gate electrode over the channel region, the gate electrode and the insulating layer establishing an electric field therebetween when the transistor is powered.

6. The transistor of claim 5, wherein the insulating layer includes a material selected from silicon oxide, silicon nitride ($Si_3N_4$) and aluminum oxide ($Al_2O_3$).

7. The transistor of claim 5, wherein the insulating layer includes a material selected from silicon dioxide ($SiO_2$), boron doped silicon glass (BSG), phosphorous doped silicon glass (PSG) and boron and phosphorous doped silicon glass (BPSG).

8. The transistor of claim 5, wherein the dopant in the insulating layer has a concentration ranging from $1\times10^{12}$ $cm^{-3}$ to $5\times10^{13}$ $cm^{-3}$.

9. The transistor of claim 5, wherein the source and drain regions include dopant of the first dopant type, and the channel region includes dopant of a second dopant type different from the first dopant type.

10. The transistor of claim 9, wherein dopant of one of the first and second dopant types includes $B^+$, $B^{2+}$, $BF^+$, $BF_2^+$, $P^{2+}$, $P^{3+}$, $P_2^+$ and $P_3^+$.

11. The semiconductor device of claim 1, wherein the positive charge has a concentration ranging from $4\times10^{12}$ $cm^{-3}$ to $10\times10^{12}$ $cm^{-3}$.

12. The semiconductor device of claim 1, wherein the positive charge includes $B^+$, $B^{2+}$, $BF^+$, $BF_2^+$, $P^{2+}$, $P^{3+}$, $P_2^+$ and $P_3^+$.

13. The semiconductor device of claim 1, wherein the semiconductor device includes an ultra thin body (UTB) MOS transistor.

14. The semiconductor device of claim 1, wherein the substrate includes a silicon on insulator (SOI) wafer.

\* \* \* \* \*